(12) United States Patent
Boettiger et al.

(10) Patent No.: US 7,303,931 B2
(45) Date of Patent: Dec. 4, 2007

(54) MICROFEATURE WORKPIECES HAVING MICROLENSES AND METHODS OF FORMING MICROLENSES ON MICROFEATURE WORKPIECES

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 338 days.

(21) Appl. No.: 11/056,484

(22) Filed: Feb. 10, 2005

(65) Prior Publication Data

US 2006/0177959 A1 Aug. 10, 2006

(51) Int. Cl.
*H01L 21/00* (2006.01)

(52) U.S. Cl. .............................. 438/27; 438/48; 438/65; 438/75

(58) Field of Classification Search ................... 438/22, 438/24, 27, 29, 48, 65, 75; 257/222, 232, 257/431, 432; 359/619, 621
See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,435,887 A | 7/1995 | Rothschild et al. | |
| 5,505,804 A | 4/1996 | Mizuguchi et al. | |
| 5,593,913 A | 1/1997 | Aoki | |
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |

(Continued)

FOREIGN PATENT DOCUMENTS

EP 0 886 323 12/1998

(Continued)

OTHER PUBLICATIONS

U.S. Appl. No. 10/785,466, Kirby.

(Continued)

*Primary Examiner*—Hsien-Ming Lee
(74) *Attorney, Agent, or Firm*—Dickstein Shapiro LLP

(57) ABSTRACT

Microfeature workpieces having microlenses and methods of forming microlenses on microfeature workpieces are disclosed herein. In one embodiment, a method for forming microlenses includes forming a plurality of shaping members on a microfeature workpiece between adjacent pixels, reflowing the shaping members to form a shaping structure between adjacent pixels, depositing lens material onto the workpiece, removing selected portions of the lens material adjacent to the shaping structure such that discrete masses of lens material are located over corresponding pixels, and heating the workpiece to reflow the discrete masses of lens material and form a plurality of microlenses.

13 Claims, 10 Drawing Sheets

U.S. PATENT DOCUMENTS

| | | | |
|---|---|---|---|
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,266,197 B1 | 5/2001 | Glenn et al. |
| 6,259,083 B1 | 7/2001 | Kimura |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,566,762 B1 | 4/2003 | Knag et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 7,068,432 B2 * | 6/2006 | Boettiger et al. ........... 359/619 |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0214373 A1 | 10/2004 | Jiang et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07/263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.
DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st.mems/su8.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Application of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

MA, X. et al., "Low Temperature Bonding for Wafer Scale Packaging and Assembly of Micromachined Sensors," Final Report 1998-1999 for MICRO Project 98-144, 3 pages, Departments of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE, vol. 4407, p. 89-99, MEMS Design, Fabrication, Characterization, and Packaging, Uwe F. Behringer; Deepak G. Uttamchandani; Eds. Apr. 2001.

Xsil, Via Applications, 1 page, <http://www.xsil.com/viaapplications/index.htm>, retrieved from the internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

U.S. Appl. No. 10/857,948, filed Jun. 2, 2004, Boettiger et al.

Shen, X.-J. et al., "Microplastic embossing process: experimental and theoretical characterizations," Sensors and Actuators, A 97-98 (2002) pp. 428-433, Elsevier Science B.V.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

* cited by examiner

MICROFEATURE WORKPIECES HAVING MICROLENSES AND METHODS OF FORMING MICROLENSES ON MICROFEATURE WORKPIECES

CROSS-REFERENCE TO RELATED APPLICATION

This application is related to U.S. patent application Ser. No. 10/857,948, filed Jun. 2, 2004, which is hereby incorporated by reference.

TECHNICAL FIELD

The present invention is related to microfeature workpieces having microlenses and methods of forming microlenses on microfeature workpieces.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

An image sensor includes an array of pixels arranged in a focal plane. Each pixel includes a photogate, photoconductor, or a photodiode with a doped region for accumulating a photo-generated charge. Microlenses are commonly placed over imager pixels. A microlens is used to focus light onto the initial charge accumulation region. Conventional technology uses a single microlens with a polymer coating, which is patterned into squares or circles over corresponding pixels. The microlens is heated during manufacturing to shape and cure the microlens. Use of microlenses significantly improves the photosensitivity of the imaging device by collecting light from a large light-collecting area and focusing the light onto a small photosensitive area of the sensor. The ratio of the overall light-collecting area to the photosensitive area of the sensor is known as the fill factor of the pixel.

The use of smaller-sized microlens arrays is of increasing importance in microlens optics because of the need to reduce the size of imager devices and increase imager resolution. Reducing pixel size, however, reduces the size of the charge accumulation area in the individual pixels. Accordingly, as the size of imager arrays and photosensitive regions of pixels decreases, it becomes increasingly difficult to provide a microlens capable of focusing incident light onto the photosensitive region. This problem is due in part to the difficulty in constructing a smaller microlens that has the optimal focal characteristics for the imager device and that optimally adjusts for optical aberrations introduced as the light passes through the various device layers. Also, it is difficult to correct possible distortions created by multiple regions above the photosensitive area, which result in increased crosstalk between adjacent pixels. "Crosstalk" can occur when off-axis light strikes a microlens at an obtuse angle. The off-axis light passes through planarization regions and a color filter, misses the intended photosensitive region, and instead strikes a photosensitive region in an adjacent pixel. Consequently, imagers with smaller-sized microlenses have difficulty in achieving high color fidelity and signal/noise ratios.

BRIEF DESCRIPTION OF THE DRAWINGS

FIGS. 1-5 illustrate stages in a method for manufacturing a plurality of microlenses on a microfeature workpiece in accordance with one embodiment of the invention.

FIG. 1 is a schematic side cross-sectional view of a microfeature workpiece including a substrate and a plurality of imaging dies formed in and/or on the substrate.

FIG. 4 is a schematic side cross-sectional view of the workpiece after depositing lens material onto the workpiece.

FIG. 5 is a schematic side cross-sectional view of the workpiece after reflowing the discrete masses of lens material to form a plurality of microlenses.

DETAILED DESCRIPTION

A. Overview

Figure 1:
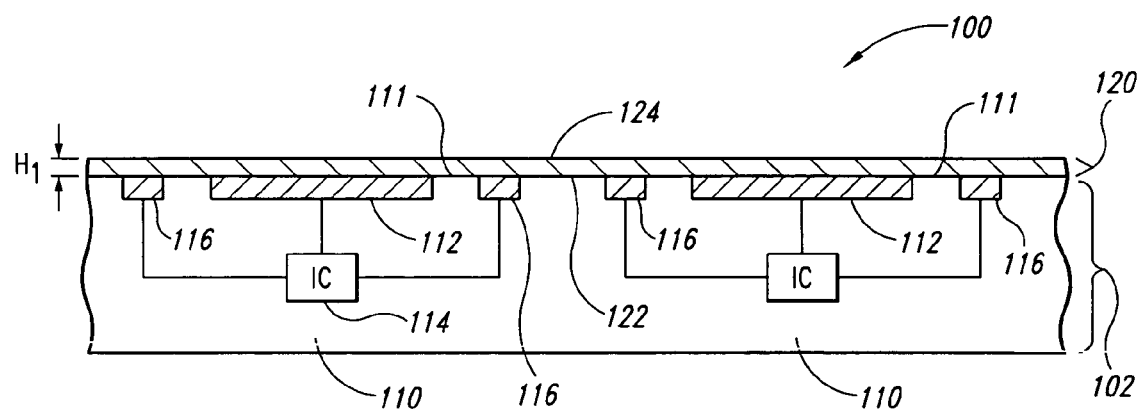

The following disclosure describes several embodiments of microfeature workpieces having microlenses and methods of forming microlenses on microfeature workpieces. One embodiment of a method for forming microlenses includes forming a plurality of shaping members on a microfeature workpiece between adjacent pixels, reconfiguring the shaping members to form a shaping structure between adjacent pixels, constructing discrete masses of lens material over corresponding pixels such that individual masses of lens material are separated from each other by the shaping structure, and reflowing the discrete masses of lens material and form a plurality of microlenses.

In one aspect of this embodiment, the shaping members are formed by depositing a photo-active layer onto a surface of the workpiece, patterning the photo-active layer, and selectively developing the photo-active layer to form the shaping members on the surface. The shaping members can include a first shaping member with a first cross-sectional area and a second shaping member with a second cross-sectional area different than the first cross-sectional area. The shaping members can have a generally similar height or different heights. The shaping structure can be a continuous frame or have discrete portions spaced apart from each other.

Another aspect of the invention is directed to methods of forming image sensors on microfeature workpieces. One embodiment of a method for forming image sensors includes constructing a plurality of pixels in and/or on a substrate and forming a shaping structure between adjacent pixels. The shaping structure has a desired configuration and defines a plurality of openings over corresponding pixels. The method further includes depositing lens material into the openings and reflowing the lens material to form a plurality of microlenses. The shape of the microlenses is at least partially dependent on the configuration of the shaping structure because, when the lens material is heated, the surface tension of the shaping structure changes the topography of the lens material.

Another aspect of the invention is directed to microfeature workpieces. In one embodiment, a microfeature workpiece includes a substrate, an array of pixels formed in and/or on the substrate, and a shaping structure formed on the substrate. The shaping structure defines a plurality of openings over corresponding pixels and has a desired configuration. The workpiece further includes a plurality of discrete masses of lens material located in corresponding openings of the shaping structure. The lens material has a solid phase and a flowable phase in which the lens material changes shape based at least partially on the configuration of the shaping structure. For example, the lens material can have a surface contour with a compound curvature and/or an asymmetrical shape corresponding at least in part to the configuration of the shaping structure.

Specific details of several embodiments of the invention are described below with reference to CMOS image sensors to provide a thorough understanding of these embodiments, but other embodiments can use CCD image sensors or other types of solid-state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, the invention may have other embodiments with additional elements or without several of the elements described below with reference to FIGS. 1-12.

B. Embodiments of Methods for Manufacturing Microlenses on Microfeature Workpieces FIGS. 1-5 illustrate stages in a method for manufacturing a plurality of microlenses on a microfeature workpiece in accordance with one embodiment of the invention. FIG. 1, for example, is a schematic side cross-sectional view of a microfeature workpiece 100 including a substrate 102 and a plurality of imaging dies 110 (only two are shown) formed in and/or on the substrate 102. The individual imaging dies 110 include a surface 111, an image sensor 112 at the surface 111, an integrated circuit 114 (shown schematically) operably coupled to the image sensor 112, and a plurality of external contacts 116 (e.g., bond-pads) operably coupled to the integrated circuit 114. The image sensor 112 includes a plurality of pixels 118 (shown in FIG. 2A) and can be a CMOS device or a CCD image sensor for capturing pictures of other images in the visible spectrum. The image sensor 112 may also detect radiation in other spectrums (e.g., IR or UV ranges). The imaging dies 110 may also include a plurality of through-wafer interconnects (not shown) extending from corresponding external contacts 116 to the back side of the die 110, as described in U.S. patent application Ser. Nos. 10/863,994 and 10/894,262, which are incorporated by reference herein.

After forming the imaging dies 110, a photo-active layer 120 is spun onto or otherwise deposited across the workpiece 100 using known processes. The photo-active layer 120 can be a layer of resist that has a first surface 122 adjacent to the surface 111 of the imaging dies 110, a second surface 124 opposite the first surface 122, and a thickness $H_1$ between the first and second surfaces 122 and 124. The resist material can be a generally transmissive material that permits light and/or other electromagnetic radiation to pass through. For example, the resist material can be similar to or the same as the lens material described below. In other embodiments, the resist material can be opaque or otherwise nontransmissive to light and/or other electromagnetic radiation.

Figure 2A:
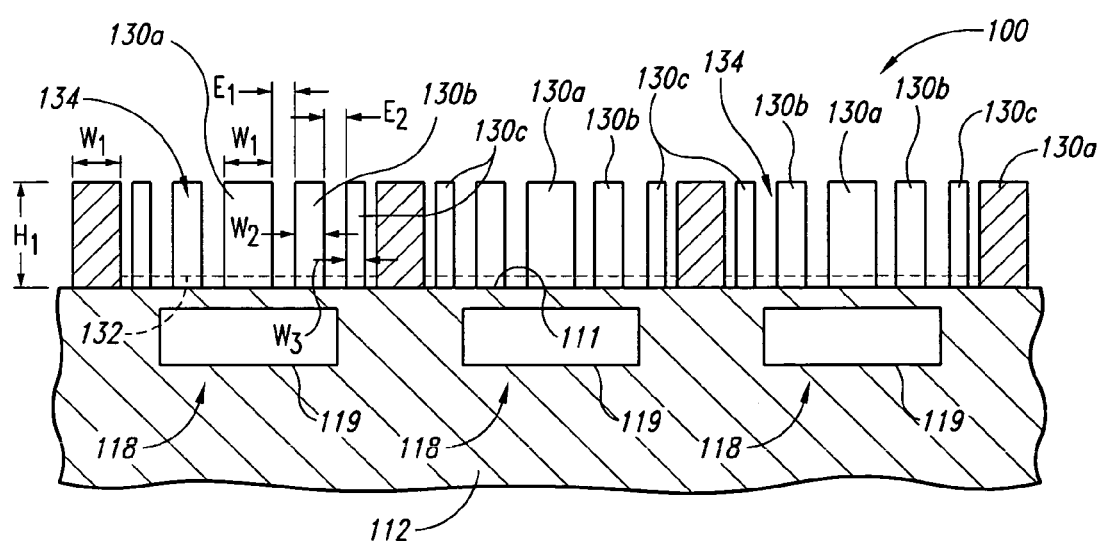
FIG. 2A is an enlarged schematic side cross-sectional view of a portion of the workpiece after patterning and developing a resist layer to form a plurality of discrete shaping members.
Figure 2B:
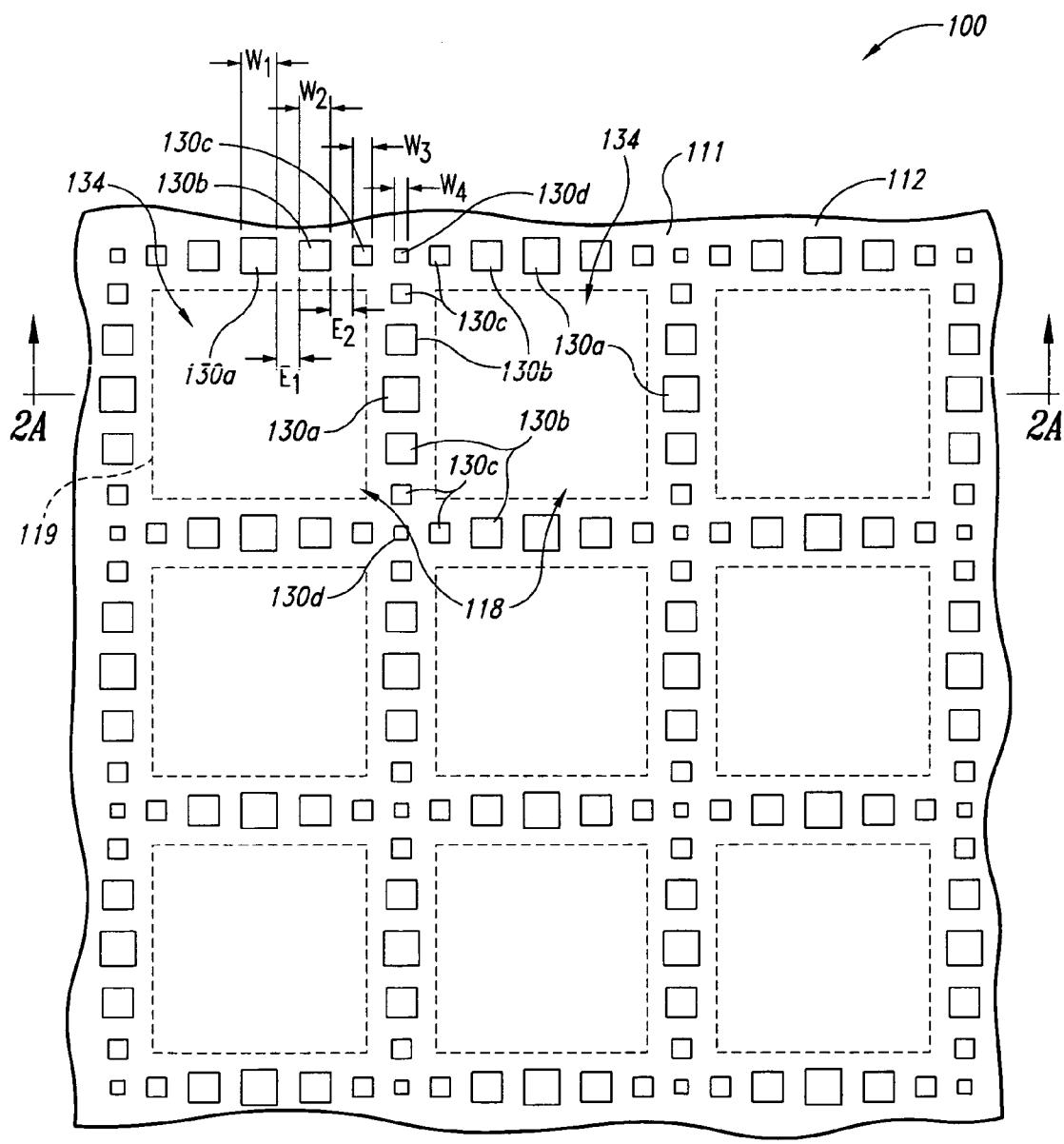
FIG. 2B is a schematic top plan view of the portion of the workpiece illustrated in FIG. 2A.

FIG. 2A is an enlarged schematic side cross-sectional view of a portion of the microfeature workpiece 100 after patterning and developing the photo-active layer 120 (FIG. 1) to form a plurality of discrete framing and/or shaping members 130. FIG. 2B is a schematic top plan view of the portion of the workpiece 100 showing the location of the cross-section illustrated in FIG. 2A. Referring to FIGS. 2A and 2B, the shaping members 130 are located between adjacent pixels 118 of the image sensor 112 and define a plurality of openings 134 over corresponding photosensors 119 of the pixels 118. Although in the illustrated embodiment, multiple shaping members 130 are located between each pair of adjacent pixels 118, in other embodiments, a single shaping member 130 can be located between each pair of adjacent pixels 118.

The shaping members 130 can have various sizes and shapes that are selected to form a shaping structure with a desired configuration, as described in detail below. For example, the illustrated shaping members 130 have a generally similar height $H_1$ (FIG. 2A) and a rectilinear cross-sectional shape. The illustrated shaping members 130 also have different cross-sectional areas selected to provide specific volumes of material for forming the shaping structure.

More specifically, one embodiment of the shaping members 130 includes a plurality of first shaping members 130a having a first width $W_1$, a plurality of second shaping members 130b having a second width $W_2$ less than the first width $W_1$, a plurality of third shaping members 130c having a third width $W_3$ less than the second width $W_2$, and a plurality of fourth shaping members 130d having a fourth width $W_4$ less than the third width $W_3$.

The spacing between adjacent shaping members 130 is also selected to provide specific volumes of material for forming the shaping structure. For example, the first and second shaping members 130a-b are separated by a first distance $E_1$, and the second and third shaping members 130b-c are separated by a second distance $E_2$ at least approximately equal to the first distance $E_1$. In other embodiments, the shaping members 130 may not be equidistant from the adjacent shaping members 130, but rather the shaping members 130 can be spaced apart by different distances. In additional embodiments, such as those described below with reference to FIGS. 8-12, the shaping members 130 can have different heights, other cross-sectional shapes, and/or the same cross-sectional area.

In the illustrated embodiment, the shaping members 130 are discrete elements that project from the surface 111 of the imaging dies 110 (FIG. 1) and are spaced apart from each other. In other embodiments, the shaping members 130 can be portions of a shaping unit that also includes a base 132 (shown with a broken line in FIG. 2A). In such embodiments, the shaping members 130 project from the base 132, and the shaping members 130 and the base 132 are integral members of the shaping unit.

Figure 3A:
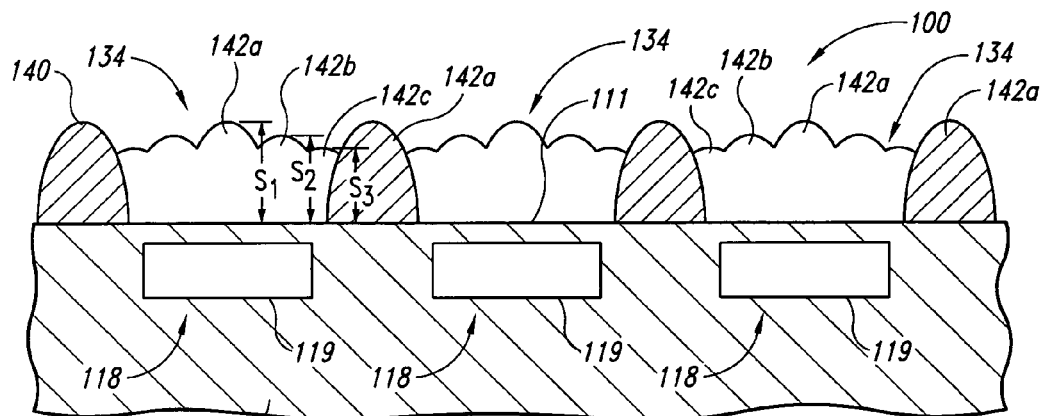
FIG. 3A is a schematic side cross-sectional view of the workpiece after reflowing the shaping members to form a shaping structure.
Figure 3B:
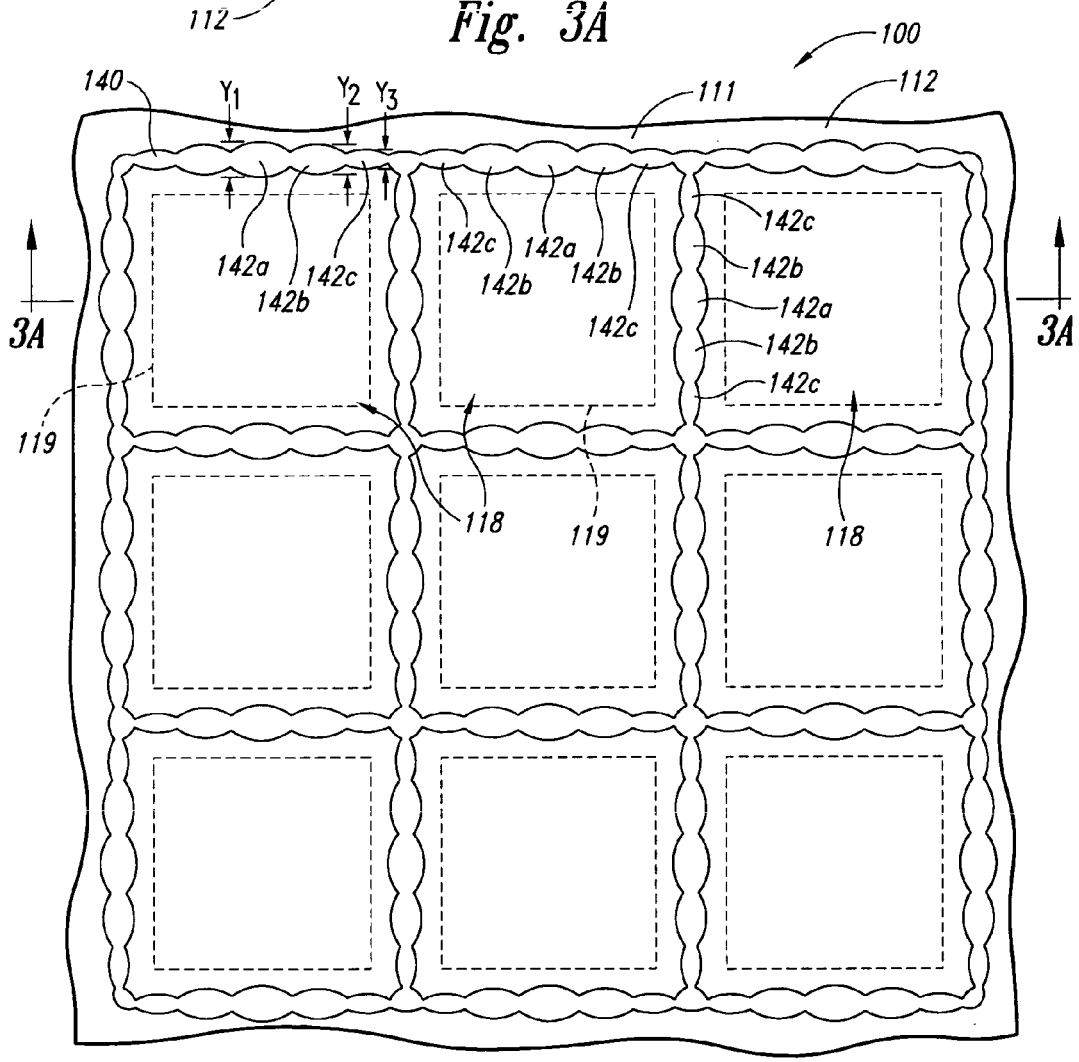
FIG. 3B is a schematic top plan view of the portion of the workpiece illustrated in FIG. 3A.

FIG. 3A is a schematic side cross-sectional view of the workpiece 100 after reflowing the shaping members 130 illustrated in FIGS. 2A and 2B to form a frame and/or shaping structure 140. FIG. 3B is a schematic top plan view of the portion of the workpiece 100 illustrated in FIG. 3A. Referring to FIGS. 3A and 3B, the illustrated shaping structure 140 has a compound curvature with a plurality of connected arcuate sections 142. For example, a plurality of first arcuate sections 142a have a first height $S_1$ (FIG. 3A) and a first width $Y_1$ (FIG. 3B), a plurality of second arcuate sections 142b have a second height $S_2$ (FIG. 3A) less than the first height $S_1$ and a second width $Y_2$ (FIG. 3B) less than the first width $Y_1$, and a plurality of third arcuate sections 142c have a third height $S_3$ (FIG. 3A) less than the second height $S_2$ and a third width $Y_3$ (FIG. 3B) less than the second width $Y_2$.

The height, width, and surface contour of the different arcuate sections 142 of the shaping structure 140 are based on at least the following parameters: (a) the cross-sectional area of the corresponding shaping members 130 (FIG. 3A); (b) the height of the corresponding shaping members 130; (c) the spacing between the corresponding shaping members 130; (d) the length of time the corresponding shaping members 130 are heated during reflow; and (e) the properties of the material of the photoactive layer 120. For example, the first arcuate sections 142a have a greater height than the second arcuate sections 142b because the first shaping members 130a (FIG. 2B) have a larger cross-sectional area than the second shaping members 130b (FIG. 2B). The above-mentioned parameters are selected so that the different sections 142 of the shaping structure 140 have a desired configuration, including a desired height, width, and/or surface contour, to shape the microlenses 160. In other embodiments, such as those described below with reference to FIGS. 6A-7, the parameters can be changed to form a shaping structure with a different configuration. For example, the shaping structure may not have a compound curvature with connected arcuate sections, or sections of the shaping structure on opposite sides of a pixel may have different configurations.

Figure 4:
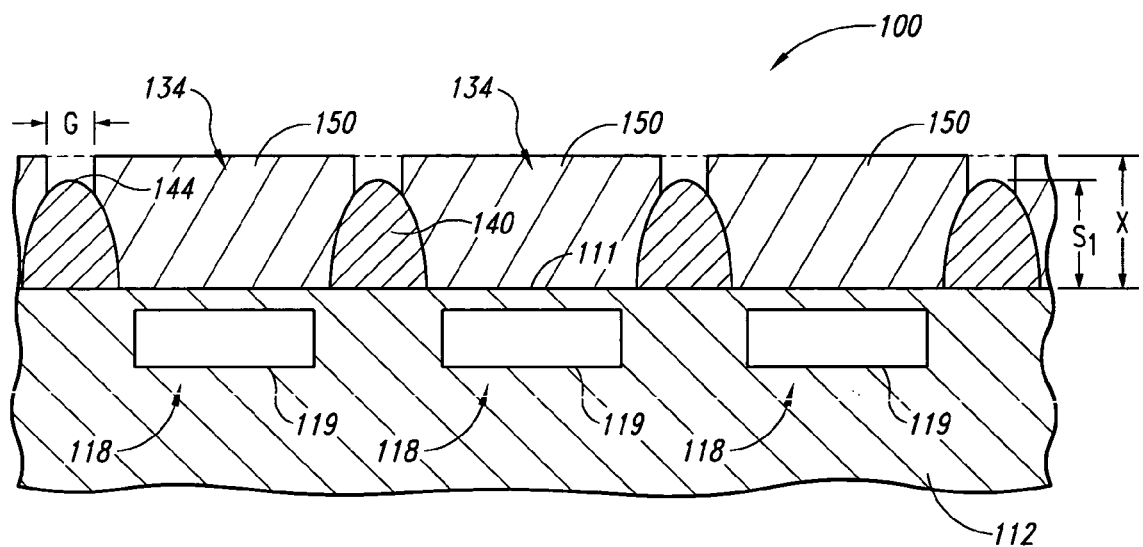

FIG. 4 is a schematic side cross-sectional view of the workpiece 100 after depositing lens material 150 across the surface 111 of the image sensor 112. The lens material 150 can be spun onto or deposited across the workpiece 100 using known methods to form an initial cover layer of lens material (shown in broken lines). In the illustrated embodiment, the lens material 150 has a thickness X greater than the height $S_1$ of the shaping structure 140 and fills the openings 134 over the pixels 118. Although the lens material 150 covers the shaping structure 140 in the illustrated embodiment, in other embodiments, the lens material 150 can be deposited into the openings 134 and have a thickness less than the height of at least some of the sections 142 of the shaping structure 140. The lens material 150 is a generally translucent material for allowing light and other electromagnetic radiation to pass through the material 150 and strike the photosensors 119. The lens material 150 can be the same material used to form the shaping structure 140 in several applications.

After depositing the cover layer of lens material 150 across the workpiece 100, portions of lens material 150 over the shaping structure 140 are removed to at least partially expose a surface 144 of the shaping structure 140 and form discrete masses of lens material 150 over corresponding pixels 118. The portions of lens material 150 can be removed by constructing a pattern on the lens material 150 and then etching, washing, or using other suitable processes to expose the surface 144. The discrete masses of lens material 150 are spaced apart from adjacent masses of lens material 150 by a gap G. The gap G is sized to expose a sufficient portion of the surface 144 of the shaping structure 140 such that the surface 144 helps shape the discrete masses of lens material 150 into a desired configuration during reflow.

Figure 5:
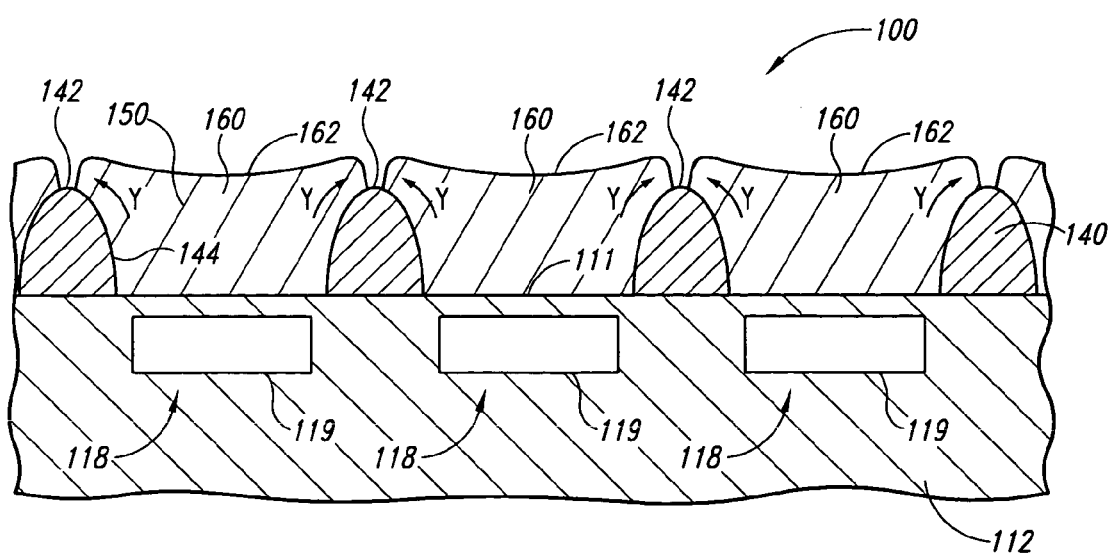

FIG. 5 is a schematic side cross-sectional view of the workpiece 100 after reflowing the discrete masses of lens material 150 to form a plurality of microlenses 160. During reflow, the lens material 150 changes from a generally solid phase to a generally flowable phase such that the surface tension of the exposed surface 144 draws lens material 150 upwardly along the surface 144 in a direction Y. Because different sections 142 of the shaping structure 140 have different heights, widths, and surface contours, the movement of the lens material 150 adjacent to each section 142 of the shaping structure 140 depends at least partially on the configuration of that particular section 142 of the shaping structure 140. Consequently, the lens material 150 may flow into a complex, asymmetrical shape as the material 150 adjacent to the shaping structure 140 is drawn upwardly in the direction Y by the surface tension of the exposed surface 144. The cured masses of lens material 150 form microlenses 160 having a top surface 162 with a desired surface contour that corresponds in part to the configuration of the shaping structure 140 for directing light and/or other electromagnetic radiation toward corresponding photosensors 119. The configuration of the shaping structure 140 may not significantly change while the lens material 150 is reflowed because the shaping structure 140 has been already cured.

One feature of the method illustrated in FIGS. 1-5 is that the microlenses 160 can be formed into complex shapes that are better able to direct/focus the radiation onto the individual pixels. For example, the microlenses 160 can have an asymmetrical shape and/or a surface contour with a compound curvature. An advantage of this feature is that the shape of the microlens 160 can be selected to accurately focus light at a desired area of the pixel 118, such as the photosensor 119. For example, the photosensor 119 can be offset from the center of the microlens 160 and the complex shape of the microlens 160 can accurately focus the light at the photosensor 119. Moreover, the microlens 160 can accurately focus light at the photosensor 119 independent of where the light strikes the microlens 160. For example, the microlens 160 can accurately focus light that impinges upon a perimeter section of the microlens 160 and accurately focus light that impinges upon a central section of the microlens 160. Furthermore, by accurately focusing light, the microlenses 160 reduce the crosstalk between adjacent pixels 118. Crosstalk can occur when off-axis light strikes a microlens at an obtuse angle, passes through a color filter, misses the intended photosensor 119, and strikes a photosensor 119 in an adjacent pixel 118. Therefore, the illustrated microlenses 160 enhance performance of a device by reducing crosstalk and accurately focusing light toward the pixels 118.

C. Additional Embodiments of Shaping Structures for Forming Microlenses

Figure 6A:
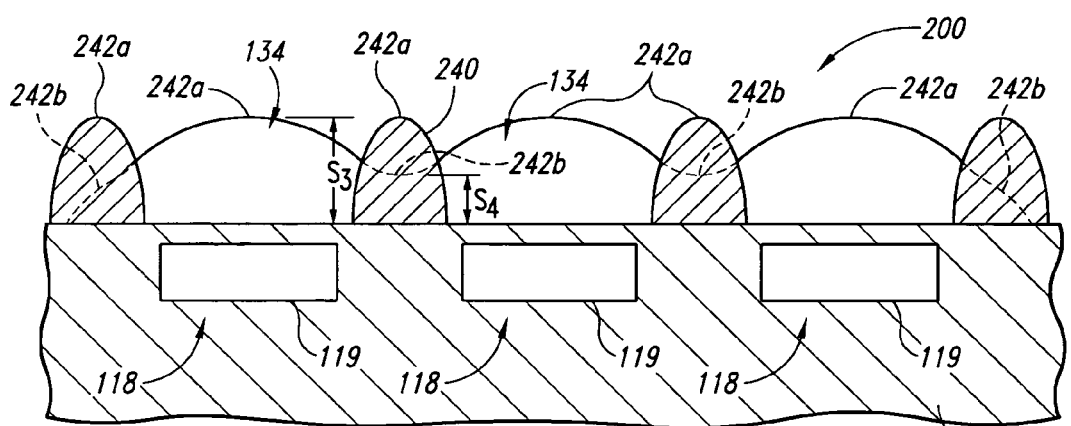
FIG. 6A is a schematic side cross-sectional view of a workpiece with a shaping structure in accordance with another embodiment of the invention.
Figure 6B:
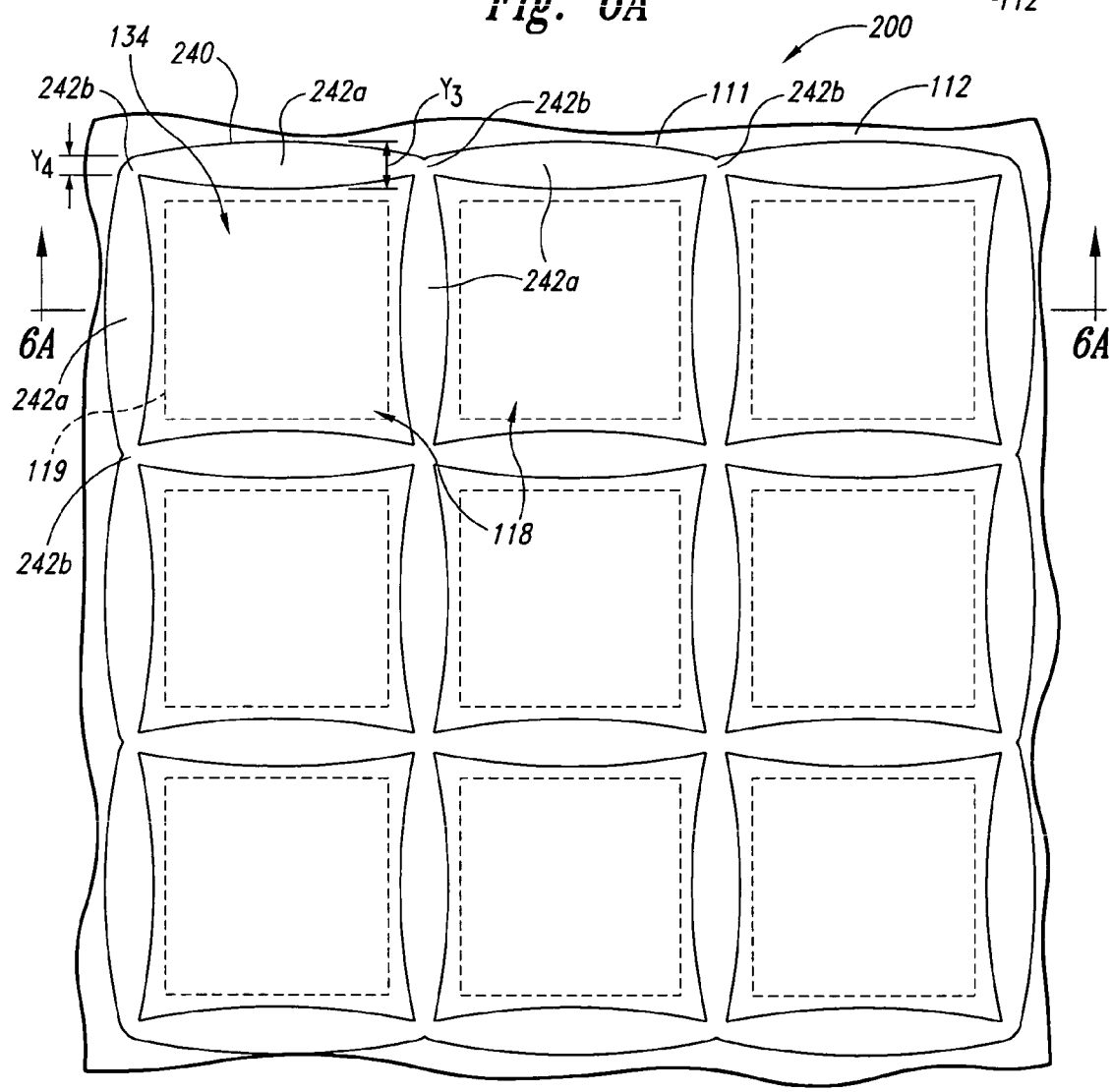
FIG. 6B is a schematic top plan view of the workpiece of FIG. 6A.

FIG. 6A is a schematic side cross-sectional view of a workpiece 200 with a shaping structure 240 in accordance with another embodiment of the invention. FIG. 6B is a schematic top plan view of the portion of the workpiece 200 illustrated FIG. 6A. Referring to FIGS. 6A and 6B, the illustrated shaping structure 240 includes a plurality of first sections 242a having a first height $S_3$ (FIG. 6A) and a first width $Y_3$ (FIG. 6B), and a plurality of second sections 242b having a second height $S_4$ (FIG. 6A) less than the first height $S_3$ and a second width $Y_4$ (FIG. 6B) less than the first width $Y_3$. The illustrated shaping structure 240 has a generally downward slope extending from the first sections 242a to the second sections 242b, as opposed to the compound curvature of the shaping structure 140 illustrated in FIGS. 3A and 3B. The illustrated shaping structure 240 can be formed by reflowing the shaping members 130, described above with reference to FIGS. 2A and 2B, for a longer period of time than the reflow time required to form the shaping structure 140 illustrated in FIGS. 3A and 3B. In other embodiments, the shaping structure 240 can have other configurations. For example, the second sections 242b can have a greater height than the first sections 242a.

Figure 7:
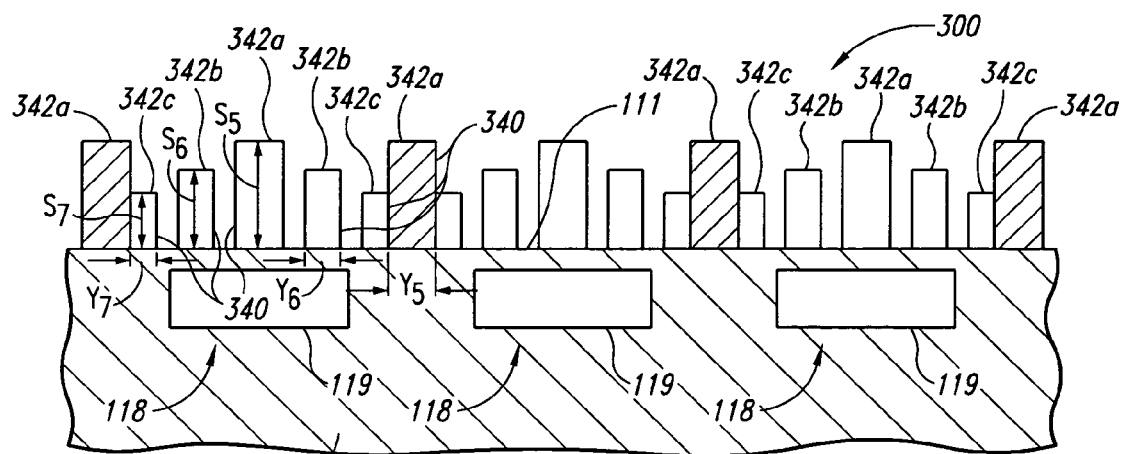
FIG. 7 is a schematic side cross-sectional view of a workpiece having a shaping structure in accordance with another embodiment of the invention.

FIG. 7 is a schematic side cross-sectional view of a workpiece 300 having an at least partially cured shaping structure 340 in accordance with another embodiment of the invention. The shaping structure 340 includes a plurality of discrete sections 342 projecting from the surface 111. In the illustrated embodiment, the individual sections 342 are deposited and/or formed so that they spaced apart from each other and have different heights and widths. For example, a first section 342a has a first height $S_5$ and a first width $Y_5$, a second section 342b has a second height $S_6$ less than the first height $S_5$ and a second width $Y_6$ less than the first width $Y_5$, and a third section 342c has a third height $S_7$ less than the second height $S_6$ and a third width $Y_7$ less than the second width $Y_6$. In other embodiments, the sections 342 can have generally similar heights and/or widths. The illustrated shaping structure 340 can be formed by reflowing the discrete shaping structure members 130, described above in FIGS. 2A and 2B, for a shorter period of time than the reflow time required to form the shaping structure 140 illustrated in FIGS. 3A and 3B.

D. Additional Embodiments of Shaping Members for Forming Microlenses

Figure 8:
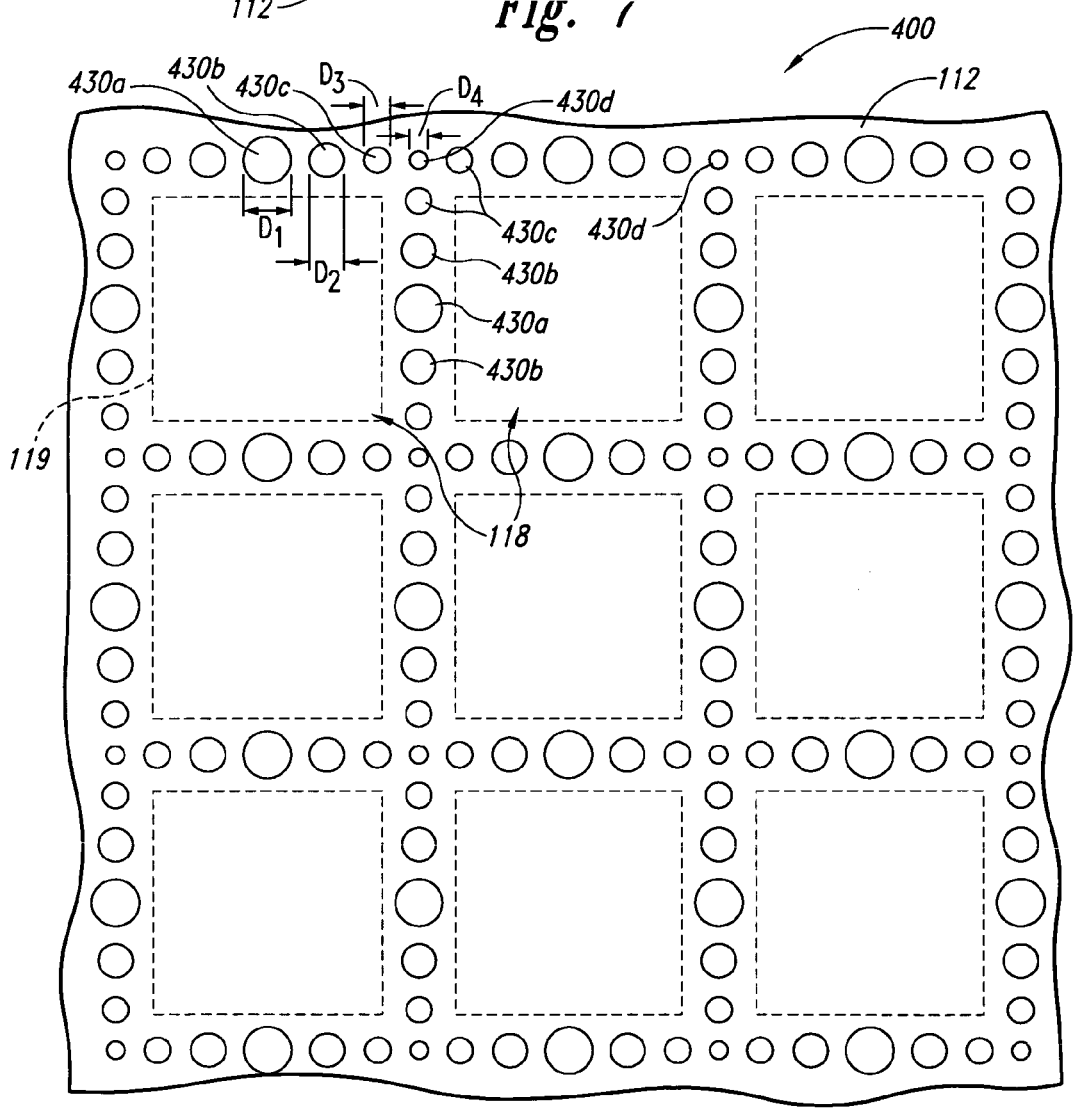
FIG. 8 is a schematic top plan view of a workpiece having a plurality of shaping members located between adjacent pixels in accordance with another embodiment of the invention.

FIGS. 8-12 illustrate workpieces having a plurality of shaping members in accordance with different embodiments of the invention. For example, FIG. 8 is a schematic top plan view of a workpiece 400 having a plurality of shaping members 430 located between adjacent pixels 118. The illustrated shaping members 430 have generally circular cross-sectional shapes with different cross-sectional areas corresponding to the position of the shaping member 430 relative to the associated pixel 118. For example, a first shaping member 430a has a first diameter $D_1$, a second shaping member 430b has a second diameter $D_2$ less than the first diameter $D_1$, a third shaping member 430c has a third diameter $D_3$ less than the second diameter $D_2$, and a fourth shaping member 430d has a fourth diameter $D_4$ less than the third diameter $D_3$. As described above with reference to FIGS. 2A and 2B, the shaping members 430 can have a generally similar height or different heights. In either case, the shaping members 430 are sized and arranged to form a shaping structure with a desired configuration.

Figure 9:
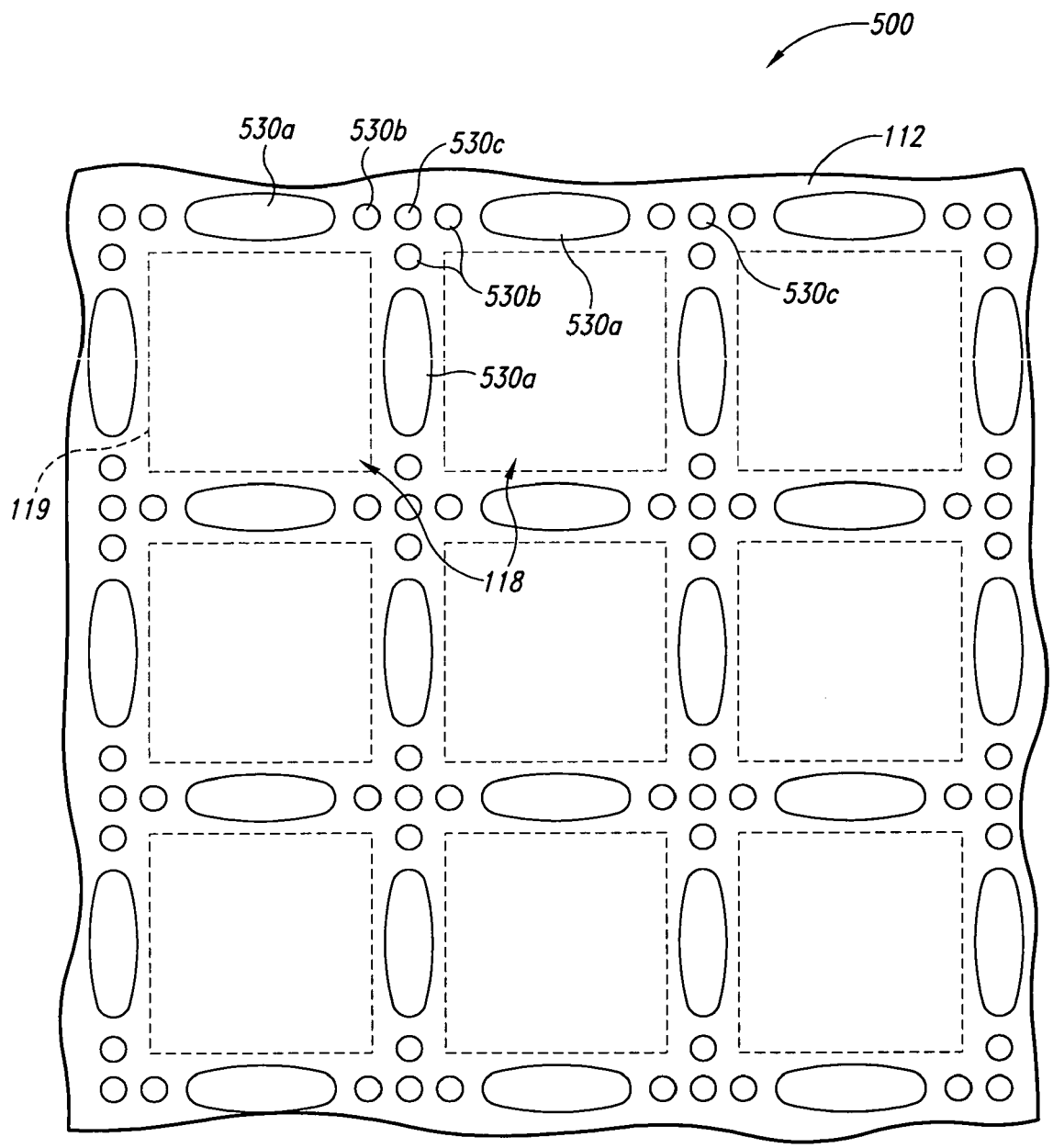
FIG. 9 is a schematic top plan view of a workpiece having a plurality of shaping members located between adjacent pixels in accordance with another embodiment of the invention.

FIG. 9 is a schematic top plan view of a workpiece 500 having a plurality of shaping members 530 in accordance with another embodiment of the invention. The illustrated shaping members 530 have different cross-sectional shapes and areas. For example, a first shaping member 530a has a generally oval cross-sectional shape with a first cross-sectional area, and second and third shaping members 530b-c have generally circular cross-sectional shapes and second cross-sectional areas less than the first cross-sectional area.

Figure 10:
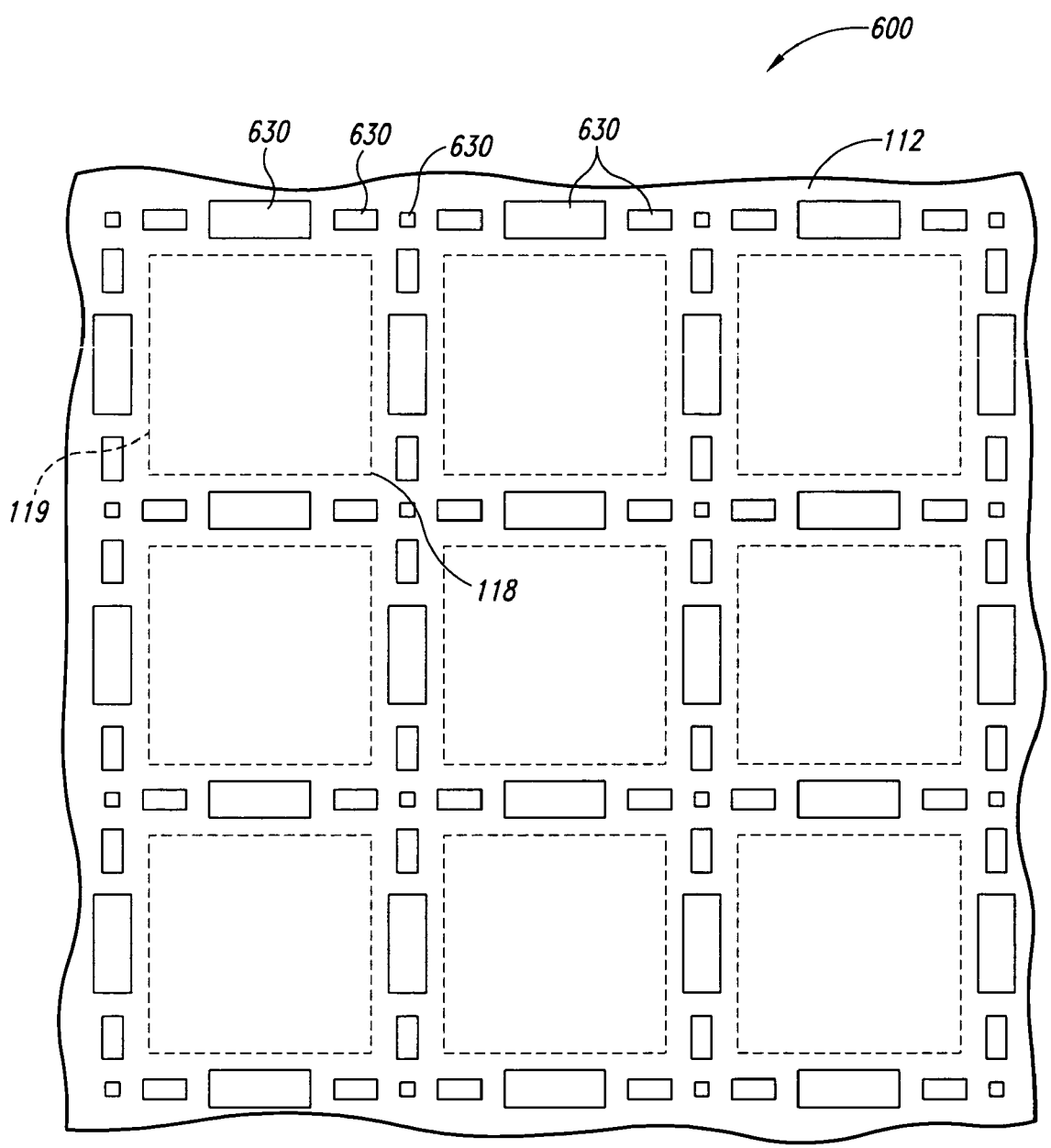
FIG. 10 is a schematic top plan view of a workpiece having a plurality of shaping members located between adjacent pixels in accordance with another embodiment of the invention.

FIG. 10 is a schematic top plan view of a workpiece 600 having a plurality of shaping members 630 arranged between adjacent pixels 118. The illustrated shaping members 630 have generally rectangular cross-sectional shapes with different cross-sectional areas corresponding to the position of the shaping member 630 relative to the associated pixel 118.

Figure 11:
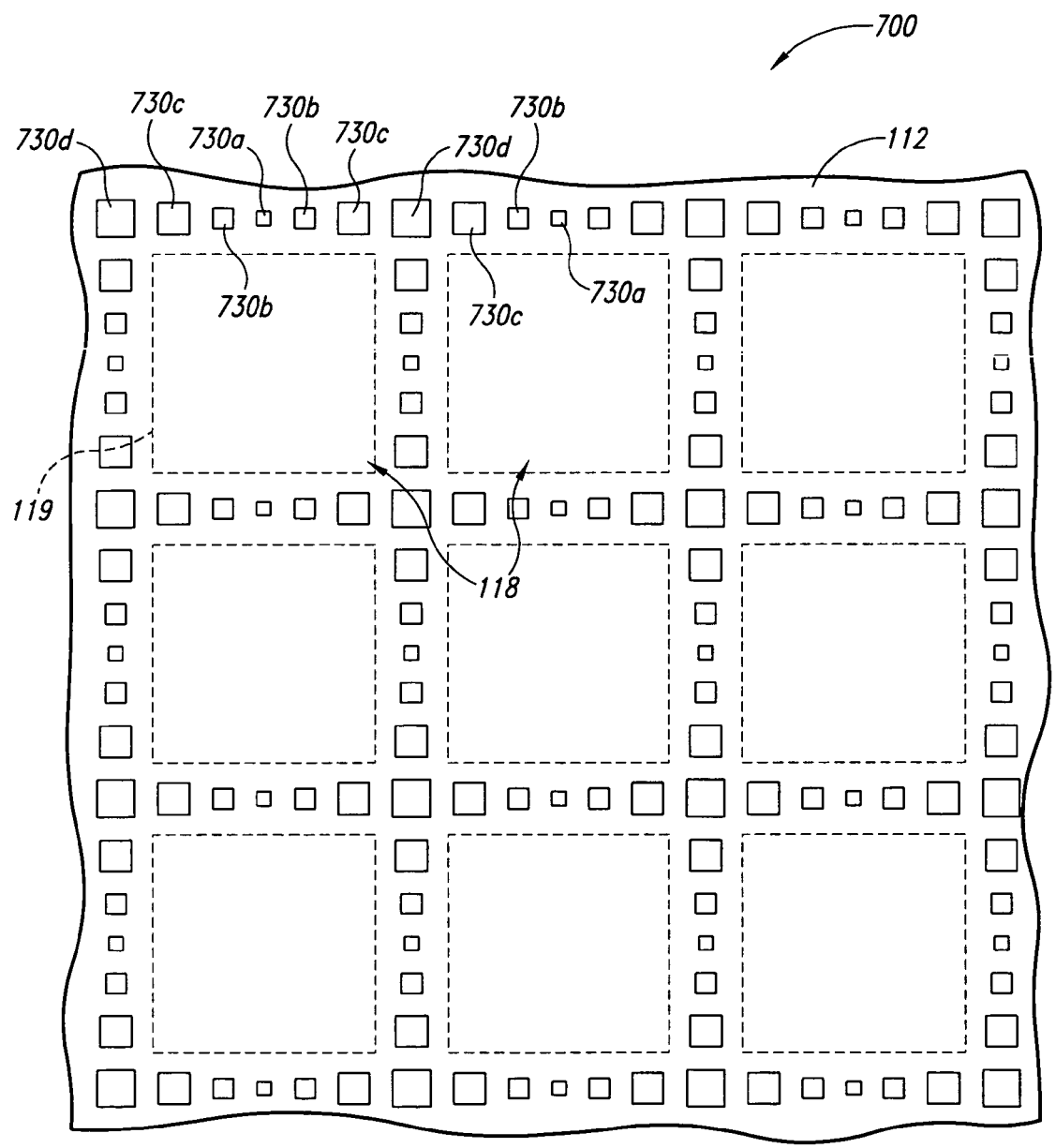
FIG. 11 is a schematic top plan view of a workpiece having a plurality of shaping members located between adjacent pixels in accordance with another embodiment of the invention.

FIG. 11 is a schematic top plan view of a workpiece 700 having a plurality of shaping members 730 located between adjacent pixels 118. The illustrated shaping members 730 have different cross-sectional areas corresponding to the position of the shaping member 730 relative to the associated pixel 118. For example, a first shaping member 730a has a first cross-sectional area, a second shaping member 730b has a second cross-sectional area greater than the first cross-sectional area, a third shaping member 730c has a third cross-sectional area greater than the second cross-sectional area, and a fourth shaping member 730d has a fourth cross-sectional area greater than the third cross-sectional area.

Figure 12:
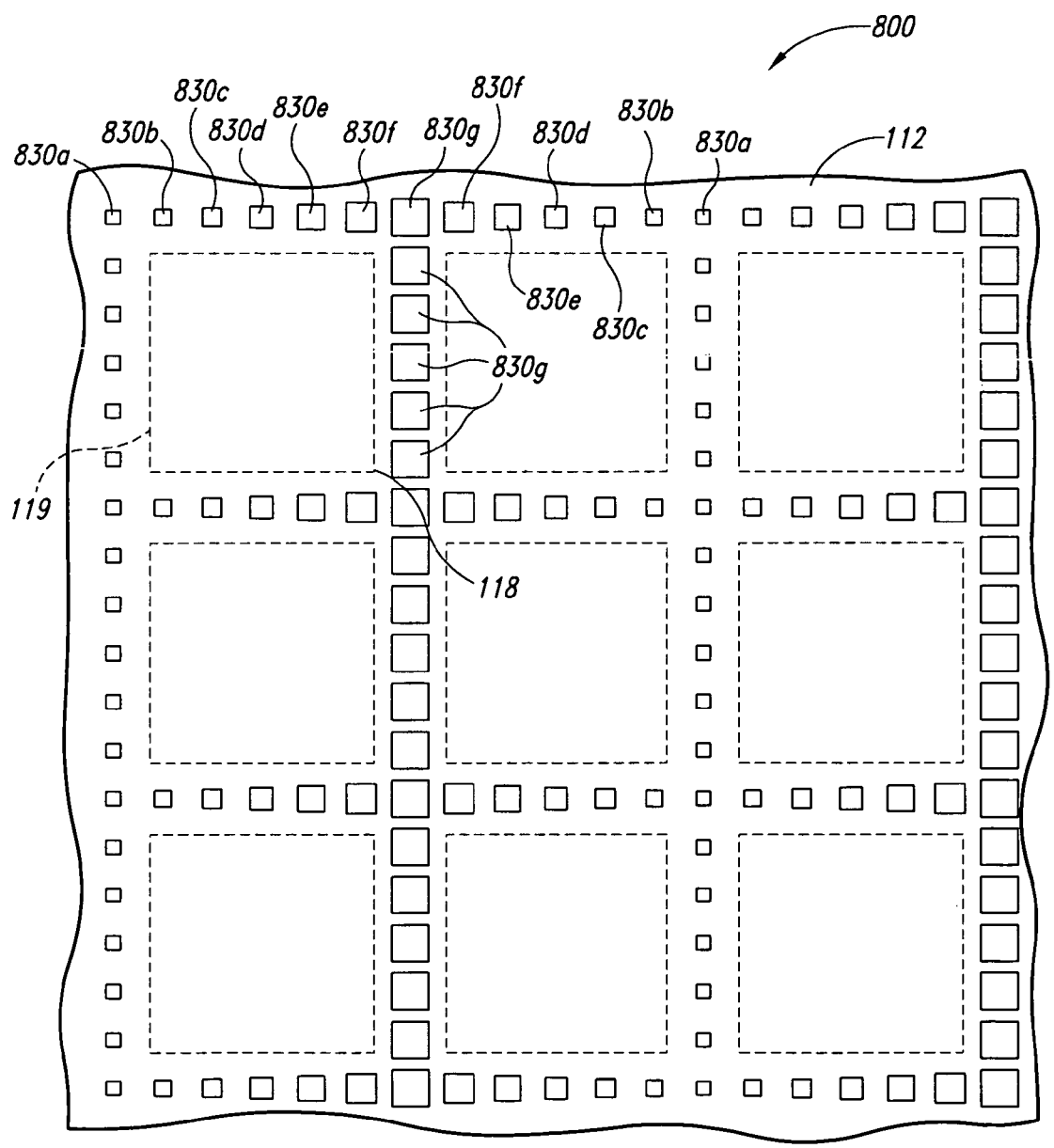
FIG. 12 is a schematic top plan view of a workpiece having a plurality of shaping members located between adjacent pixels in accordance with another embodiment of the invention.

FIG. 12 is a schematic top plan view of a workpiece 800 having a plurality of shaping members 830 located between adjacent pixels 118. The illustrated shaping members 830 have different cross-sectional areas corresponding to the position of the shaping member 830 relative to the associated pixel 118. For example, a first shaping member 830a has a first cross-sectional area, a second shaping member 830b has a second cross-sectional area greater than the first cross-sectional area, a third shaping member 830c has a third cross-sectional area greater than the second cross-sectional area, a fourth shaping member 830d has a fourth cross-sectional area greater than the third cross-sectional area, a fifth shaping member 830e has a fifth cross-sectional area greater than the fourth cross-sectional area, a sixth shaping member 830f has a sixth cross-sectional area greater than the fifth cross-sectional area, and a seventh shaping member

830g has a seventh cross-sectional area greater than the sixth cross-sectional area. In additional embodiments, the shaping members 830 can have different cross-sectional shapes, widths, heights, and/or cross-sectional areas to form a shaping structure with a desired configuration.

From the foregoing, it will be appreciated that specific embodiments of the invention have been described herein for purposes of illustration, but that various modifications may be made without deviating from the spirit and scope of the invention. For example, the shaping members and shaping structures can have any combination of the features described above. Accordingly, the invention is not limited except as by the appended claims.

We claim:

1. A method of forming a plurality of microlenses on a microfeature workpiece having a plurality of pixels, the method comprising:
    forming a plurality of shaping members on the microfeature workpiece between adjacent pixels;
    reconfiguring the shaping members to form a shaping structure between adjacent pixels;
    constructing discrete masses of lens material over corresponding pixels such that individual masses of lens material are separated from each other by the shaping structure; and
    reflowing the discrete masses of lens material to form a plurality of microlenses.

2. The method of claim 1 wherein:
    reconfiguring the shaping members comprises reflowing the shaping members; and
    constructing discrete masses of lens material comprises depositing lens material onto the workpiece and removing selected portions of the lens material adjacent to the shaping structure.

3. The method of claim 2 wherein the workpiece has a surface, and wherein forming the shaping members comprises:
    depositing a resist layer onto the surface of the workpiece;
    patterning the resist layer; and
    selectively developing the resist layer to form the shaping members on the surface.

4. The method of claim 2 wherein forming the shaping members comprises constructing a plurality of discrete shaping members having at least approximately the same height.

5. The method of claim 2 wherein forming the shaping members comprises constructing a first shaping member having a first cross-sectional area and a second shaping member having a second cross-sectional area different than the first cross-sectional area.

6. The method of claim 2 wherein forming the shaping members comprises constructing a base and a plurality of discrete shaping members projecting from the base, and wherein the base and shaping members are integral members of a shaping unit.

7. The method of claim 2 wherein the pixels comprise a first pixel and a second pixel adjacent to the first pixel, wherein forming the shaping members comprises forming first and second shaping members between the first and second pixels, and wherein the first shaping member is adjacent to the second shaping member and spaced apart from the second shaping member.

8. The method of claim 2 wherein removing selected portions of the lens material comprises etching the selected portions of the lens material.

9. The method of claim 2 wherein reflowing the shaping members comprises forming a continuous shaping structure.

10. The method of claim 2 wherein reflowing the shaping members comprises forming a shaping structure with discrete portions.

11. The method of claim 2 wherein the shaping members have a first height, and wherein depositing lens material onto the workpiece comprises placing a layer of lens material with a second height greater than the first height of the shaping members.

12. The method of claim 1 wherein reflowing the discrete masses comprises forming a plurality of microlenses having a shape based at least partially on a configuration of the shaping structure.

13. The method of claim 2 wherein the shaping structure comprises an opaque structure that is nontransmissive to selected radiation.

* * * * *